(12) United States Patent
Fujikami et al.

(10) Patent No.: US 9,325,601 B2
(45) Date of Patent: Apr. 26, 2016

(54) REDUCING EFFECTIVE CYCLE TIME IN ACCESSING MEMORY MODULES

(71) Applicant: Spirent Communications, Inc., Sunnyvale, CA (US)

(72) Inventors: Craig Fujikami, Honolulu, HI (US); Jocelyn Kunimitsu, Aiea, HI (US)

(73) Assignee: Spirent Communications, Inc., Sunnyvale, CA (US)

(*) Notice: Subject to any disclaimer, the term of this patent is extended or adjusted under 35 U.S.C. 154(b) by 407 days.

(21) Appl. No.: 13/772,204

(22) Filed: Feb. 20, 2013

(65) Prior Publication Data

US 2014/0237198 A1    Aug. 21, 2014

(51) Int. Cl.
*G06F 13/16*    (2006.01)
*H04L 12/26*    (2006.01)
*G06F 3/06*    (2006.01)
*G11C 7/10*    (2006.01)

(52) U.S. Cl.
CPC .............. *H04L 43/12* (2013.01); *G06F 3/0611* (2013.01); *G06F 3/0659* (2013.01); *G06F 3/0683* (2013.01); *G06F 13/1647* (2013.01); *G11C 7/1042* (2013.01); *G06F 2212/1024* (2013.01); *G06F 2212/2532* (2013.01); *G11C 2207/2272* (2013.01)

(58) Field of Classification Search
None
See application file for complete search history.

(56) References Cited

U.S. PATENT DOCUMENTS

| | | | |
|---|---|---|---|
| 7,454,555 B2 * | 11/2008 | Ware et al. .................. | 711/5 |
| 2002/0147883 A1 * | 10/2002 | Hsu et al. .................. | 711/105 |
| 2010/0332718 A1 | 12/2010 | Farrell et al. | |
| 2013/0039135 A1 * | 2/2013 | Kang et al. ............... | 365/189.16 |

* cited by examiner

*Primary Examiner* — Edward Dudek, Jr.
*Assistant Examiner* — Ralph A Verderamo, III
(74) *Attorney, Agent, or Firm* — Yiding Wu; Haynes Beffel & Wolfeld LLP

(57) ABSTRACT

A method reduces a cycle time of an individual memory module to an effective cycle time shorter than the cycle time using a plurality of memory modules having a circular sequence. The method includes initiating a set of read operations on different memory modules of the plurality of memory modules in the circular sequence from a first read operation initiated on a first module of the plurality of memory modules to a last read operation initiated on the second module. After initiating each read operation of the set of read operations on a particular memory module of the plurality of memory modules and prior to initiating a next read operation in the set of read operations, the method initiates a set of write operations to write a same value to all of the plurality of memory modules in the circular sequence beginning one memory module after the particular memory module.

16 Claims, 10 Drawing Sheets

REDUCING EFFECTIVE CYCLE TIME IN ACCESSING MEMORY MODULES

BACKGROUND

The technology disclosed relates to tracking and analyzing internet traffic flows. In particular, it relates to reducing effective cycle time in read and write operations of memory modules used in storing statistics from tracking and analyzing internet traffic flows.

When testing the internet traffic, thousands or millions of flows may be tracked and analyzed. Statistics about the individual flows, such as frame and byte counters, and error measurements, may be counted and stored in high density memory modules such as DRAMs (dynamic random access memory). Each flow contains a stream of frames. Each frame contains a number of bytes. For each frame, read and write operations are performed. To properly perform certain measurements, parameters and statistics are allowed at least one read and one write operation per frame. The shortest frame supported for a given test can be dependent on bandwidths of the memory modules. High density memory modules such as DRAMs typically have multiple banks, and each bank may have millions of memory bits. High density memory modules may be suitable for storing the statistics from testing internet, but they typically have a time penalty when accessing different rows within the same bank. This cycle time limitation can limit the minimum frame time supported by the system, and thus impact the overall system performance.

An opportunity arises to provide a method to reduce the effective cycle time in accessing memory modules used in storing statistics from tracking and analyzing internet traffic flows.

SUMMARY

A method reduces a row cycle time of an individual memory module to an effective row cycle time shorter than the row cycle time using a plurality of memory modules having a circular sequence. The method includes initiating a set of read operations on different memory modules of the plurality of memory modules in the circular sequence from a first read operation initiated on a first module of the plurality of memory modules to a last read operation initiated on the second module. After initiating each read operation of the set of read operations on a particular memory module of the plurality of memory modules and prior to initiating a next read operation in the set of read operations, the method initiates a set of write operations to write a same value to all of the plurality of memory modules in the circular sequence beginning one memory module after the particular memory module.

DETAILED DESCRIPTION

The following detailed description is made with reference to the figures. Examples are described to illustrate the present technology, not to limit its scope, which is defined by the claims. Those of ordinary skill in the art will recognize a variety of equivalent variations on the description that follows.

Figure 1:
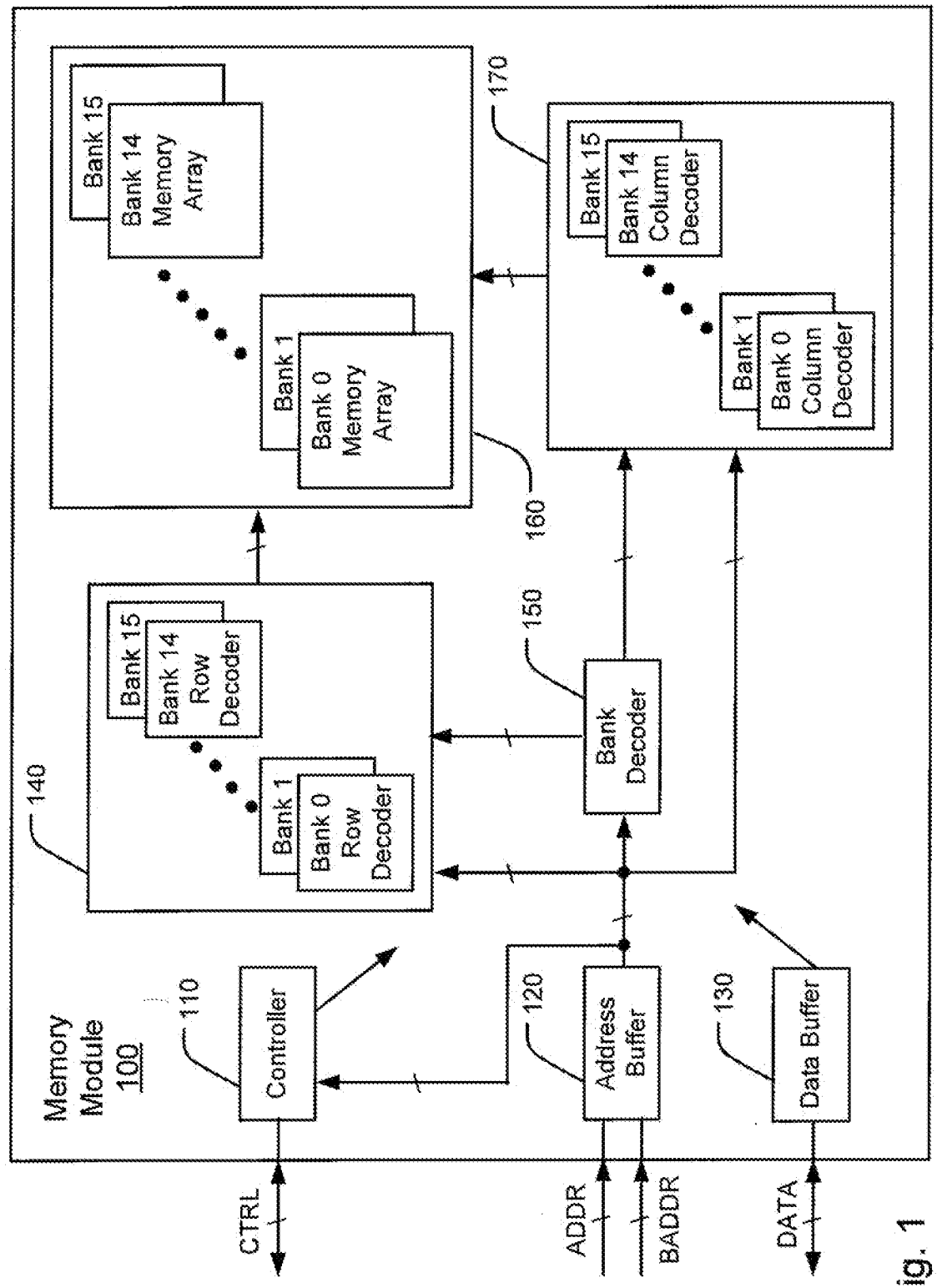
FIG. 1 is a block diagram of a memory module including banks of memory arrays.

FIG. 1 is a block diagram of a memory module 100 including banks of memory arrays. The memory module 100 may be a high density memory module used to store statistics from tracking and analyzing internet traffic flows. The number of banks in the memory module 100 may vary. For instance, in reference to FIG. 1, the memory module 100 includes a plurality of banks 160 with 16 banks of memory arrays including Bank 0, Bank 1, . . . Bank 14, and Bank 15.

A bank address BADDR selects a bank of memory array within the plurality of banks 160 to which a read or write command is applied. To select from 16 banks, the bank address BADDR may include 4 bits. To select from $2^N$ banks, the bank address BADDR may include N bits. Row and column addresses ADDR select memory locations inside each bank for read and write operations. For example, ADDR may include 13 bits to address $2^{13}$ rows, and 7 bits to address $2^7$ columns.

The bank addresses BADDR and row and column addresses ADDR are registered by address buffer 120. The registered addresses are coupled to a bank decoder, 150, a plurality of row decoders 140, and a plurality of column decoders 170. Outputs from the bank decoder 150 are also coupled to the plurality of row decoders 140, and the plurality of column decoders 170.

Row decoders in the plurality of row decoders 140 and column decoders in the plurality of column decoders 170 correspond to banks of memory array in the plurality of banks 160. For instance, Bank 0 row decoder and Bank 0 column decoder correspond to Bank 0 memory array. For another instance, Bank 14 row decoder and Bank 14 column decoder correspond to Bank 14 memory array.

The memory module includes a controller 110. The controller 110 is coupled to control signals CTRL. The control signals CTRL may include input clock signals, chip select and reset signals, output data valid signal, etc. The controller 110 includes logic coupled to the plurality of banks 160 of memory arrays. The logic controls the read of and write operations on data signals DATA. Data signals DATA are registered by a data buffer 130, and are coupled to the plurality of banks 160 of memory arrays. Data signals DATA may be input data signals for write operations and output data signals for read operations.

In an environment for testing internet traffic flows, a processor communicates with a multiplicity of internet traffic flows at a communication line rate, such as 10 GbE (Gigabit Ethernet), 40 GbE, or 100 GbE. The processor performs a read operation and a write operation within a frame time in an internet traffic flow, and may optionally perform a modify operation within the same frame time. A minimum frame size in an internet traffic flow is 64 bytes, plus an 8 byte preamble plus a 12 byte gap, for a total of 84 bytes per frame. Accordingly, using the 10 GbE communication line rate as an example, a minimum frame time is: 84 bytes times 8 bits per byte divided by $10 \times 10^9$ bits per second=67 ns, after truncating the fractional time. With communication line rates at 40 GbE and 100 GbE, the minimum frame time is 16 ns and 6 ns, respectively.

The access time for a memory module, such as the memory module with banks of memory arrays as illustrated in FIG. 1, is limited by a row cycle time. The row cycle time is the minimum time between accesses to memory locations within a same bank of the memory module. Because of the limitation by the row cycle time, the shortest read and write operation for a specific statistics parameter is 2 times the row cycle time, since the next read and write operation may be in the same bank. One row cycle is required for the read operation, and another row cycle is required for the subsequent write operation, while the next read and write operation in the same bank cannot start until the current read and write operation is completed.

Thus, for slower communication line rates, the row cycle time may not limit the read and write operations within the same bank. But for faster communication line rates, the row cycle time may be longer than the frame time. For example, if the row cycle time is 8 ns (nano-seconds) and twice the row cycle time is 16 ns, it is fast enough for a read and write operation at the communication line rates of 10 GbE and 40 GbE, since they correspond to a frame time of 67 ns and 16 ns, as described above. However, at the communication line rate of 100 GbE, the frame time is reduced to 6 ns, less than twice the row cycle time of 16 ns, so it is not possible to perform a read and write operation, which requires 16 ns, within the frame time of 6 ns. Thus, the row cycle time may become 3 ns so twice the row cycle time can be 6 ns to accurately track the internet traffic flows at the communication line rate of 100 GbE.

Figure 2:
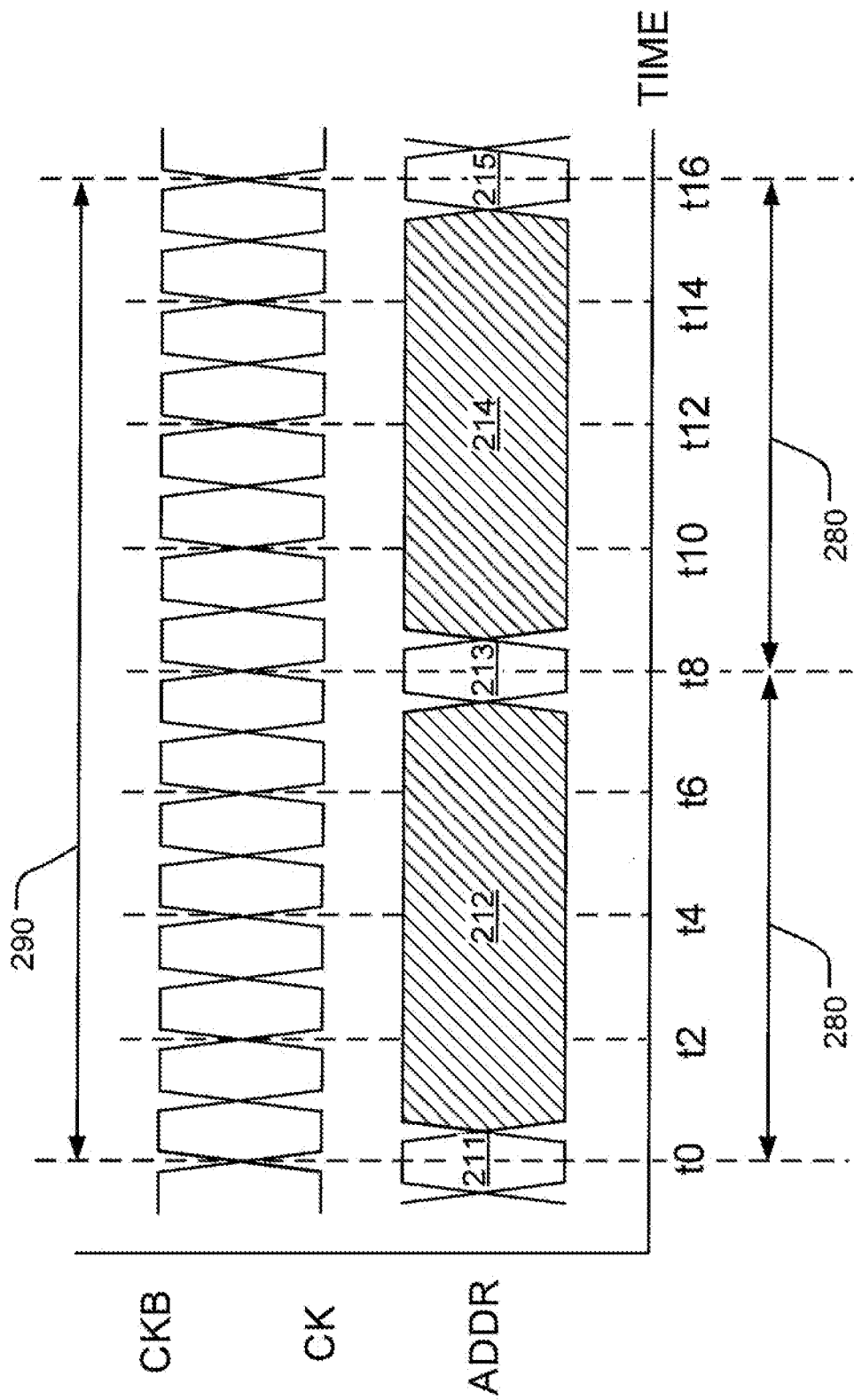
FIG. 2 is a simplified timing diagram illustrating the row cycle time.

FIG. 2 is a simplified timing diagram illustrating the row cycle time. The timing diagram includes a pair of differential input signals CK and CKB that coordinates read and write operations of the memory module. The timing diagram includes the row and column addresses ADDR of the memory module. For brevity, control signals are omitted in FIG. 2. Addresses shown are for a particular bank in the banks of memory arrays in the memory module 100. For instance, at time t0, row and column addresses ADDR 211 are registered for Bank 0 for a read operation. At time t8, row and column addresses ADDR 213 are registered for Bank 0 for a subsequent write operation, after the completion of the read operation. At time t16, row and column addresses ADDR 215 are registered for Bank 0 for another read operation, after the completion of the prior read and write cycle between time t0 and time t16. During the time period 212 between time t0 and t8, and the time period 214 between time t8 and t16, the row and column addresses ADDR are at "don't care" states, not affecting read or write operations of the memory module.

The read operation between time t0 and t8 is limited by the row cycle time 280. The write operations between time t8 and t16 is also limited by the row cycle time 280. For sequential access to a particular bank of an individual memory module, the minimum row cycle time is required for a read operation or a write operation between two address changes. The minimum total time 290 for read and write operations between time t0 and t16 for a particular bank of memory arrays within an individual memory module is twice the row cycle time 280.

The present technology provides a method that reduces a row cycle time of an individual memory module to an effective row cycle time shorter than the row cycle time using a plurality of memory modules having a circular sequence.

Figure 3:
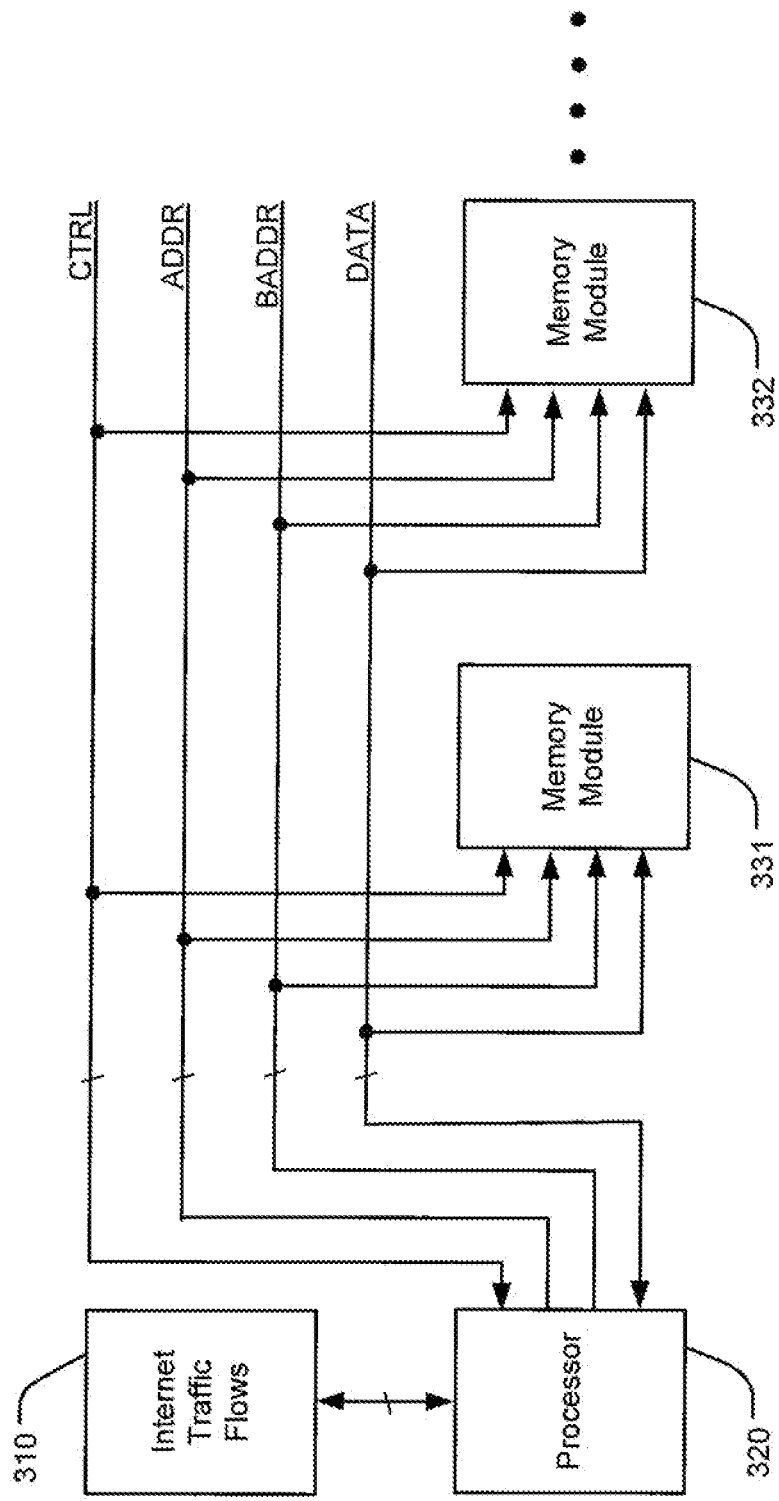
FIG. 3 is a block diagram of an example computer system including a plurality of memory modules as illustrated in FIG. 1.

FIG. 3 is a block diagram of an example computer system including a plurality of memory modules. The example computer system can be used for tracking and analyzing internet traffic flows in accordance with the present technology. In reference to FIG. 3, the example computer system includes a processor 320 that communicates with a multiplicity of internet traffic flows 310, and the plurality of memory modules including at least a first memory module 331 and a second memory module 332. Although only one processor and only two memory modules are illustrated, one or more processors, and/or more than two memory modules may be configured to perform operations in accordance with the present technology.

In one implementation, memory modules 331 and 332 are instances of the memory module 100 as illustrated in FIG. 1. The example computer system may have physically the same memory location across each memory module. The memory location is determined by the bank address BADDR and the row and column addresses ADDR.

For example, if bank address BADDR includes bit 0, bit 1, bit 2 and bit 3 for selecting banks of memory arrays in a memory module, then bit 0, bit 1, bit 2 and bit 3 of the bank address BADDR of the memory module 331 are physically connected to bit 0, bit 1, bit 2 and bit 3 of the bank address BADDR of the memory module 332, respectively. Similarly, each bit of the row and column addresses ADDR in a memory module is physically connected to a corresponding bit of the row and column addresses ADDR in another memory module in the plurality of memory modules. With the same memory location across memory modules, the example computer system may be able to write a same value to all of the plurality of memory modules.

The example computer system also has the same connections for data signals DATA across each memory module. For example, if the data signals DATA include N bits, then bit 0, bit 1, bit 2, bit 3, . . . through bit (N−1) of the data signals DATA of the memory module 331 are physically connected to bit 0, bit 1, bit 2, bit 3, . . . through bit (N−1) of the data signals DATA of the memory module 332, respectively.

Figure 4:
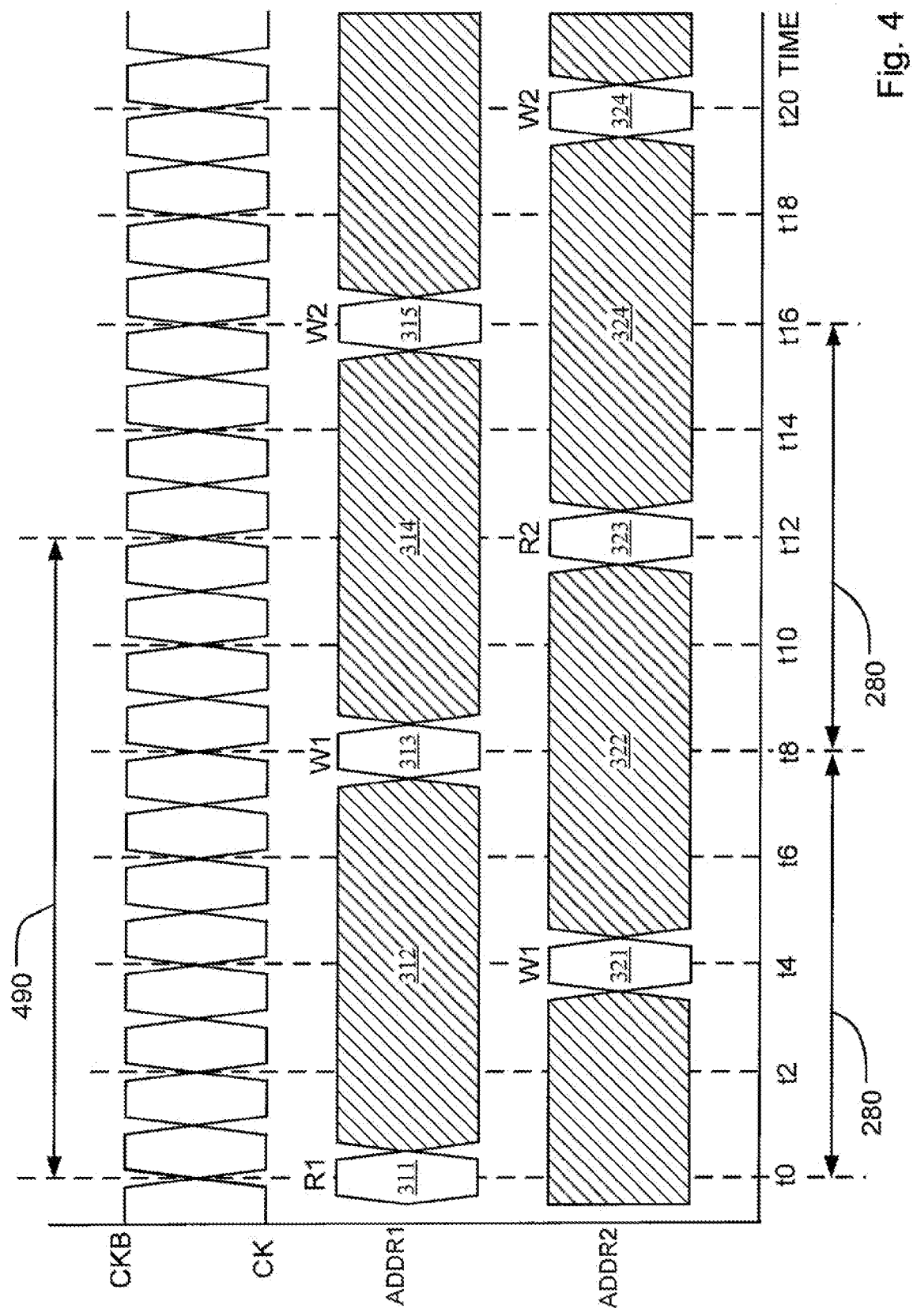
FIG. 4 is a simplified timing diagram illustrating a shortened effective row cycle time with two memory modules.

FIG. 4 is a simplified timing diagram illustrating a shortened effective row cycle time with two memory modules, in accordance with the present technology. The timing diagram includes a pair of differential input signals CK and CKB that coordinates read and write operations of the plurality of memory modules. The timing diagram includes the row and column addresses ADDR1 for a first memory module, such as the memory module 331, and a second memory module, such as the memory module 332 illustrated in FIG. 3. For brevity, control signals are omitted in FIG. 4. The row and column addresses ADDR1 for a particular bank in the first memory module correspond to the row and column addresses ADDR2 for the same particular bank in the second memory module. Connections of signals between the processor(s) and the memory modules are described in connection with FIG. 3.

The method reduces a row cycle time of an individual memory module to an effective row cycle time shorter than the row cycle time using a plurality of memory modules including at least a first memory module and a second memory module, such as the first memory module 331 and the second memory module illustrated in FIG. 3. The method includes a circular sequence for read and write operations.

The method includes initiating a set of read operations on different memory modules of the plurality of memory modules in the circular sequence from a first read operation initiated on the first module of the plurality of memory modules to a last read operation on a second module. The set of read operations includes at least a first read operation and a second read operation.

After initiating each read operation of the set of read operations on a particular memory module of the plurality of memory modules and prior to initiating a next read operation in the set of read operations, the method includes initiating a set of write operations to write a same value to all of the plurality of memory modules. The set of write operations are in the circular sequence beginning one memory module after the particular memory module. The set of write operations includes at least a first write operation and a last write operation.

In reference to FIG. 4, at time t0, the method initiates a first read operation R1 on the first memory module of the plurality of memory modules, including registering row and column addresses ADDR1 311 for a particular bank, such as Bank 0, of the first memory module.

After initiating the first read operation R1, the method initiates a set of write operations W1 to write a same value to all of the plurality of memory modules. The set of write operations are in a circular sequence from a first write operation, at time t4, initiated on the second memory module of the plurality of memory modules to a last write operation, at time t8, initiated on the first module. The first write operation at time t4 includes registering row and column addresses ADDR2 321 for the same particular bank of the second memory module as for the read operation on the first memory module at time t0. The last write operation at time t8 includes registering row and column addresses ADDR1 313 for the same particular bank of the first memory module as for the read operation on the first memory module at time t0.

After initiating the set of write operations, the method initiates a second read operation R2, at time t12, on the second module of the plurality memory modules. The second read operation R2 includes registering row and column addresses ADDR2 323 for the particular bank of the second memory module.

After initiating the second read operation R2, the method initiates a second set of write operations W2 to write a same value to all of the plurality of memory modules. The second set of write operations W2 are in a circular sequence from a first write operation, at time t16, initiated on the first memory module of the plurality of memory modules to a last write operation, at time t20, initiated on the second module. The first write operation at time t16 includes registering row and column addresses ADDR1 315 for the same particular bank of the first memory module as for the second read operation R2 on the second memory module at time t12. The last write operation at time t20 includes registering row and column addresses ADDR2 325 for the same particular bank of the second memory module as for the second read operation R2 on the second memory module at time t12.

During the time period 312 between time t0 and t8, and the time period 314 between time t8 and t16, the row and column addresses ADDR1 are at "don't care" states, not affecting read or write operations of the memory module. Similarly, during the time period 322 between time t4 and t12, and the time period 324 between time t12 and t20, the row and column addresses ADDR2 are at "don't care" states, not affecting read or write operations of the memory module.

As illustrated in FIG. 4, a minimum total time 490 for read and write operations is less than twice the row cycle time 280 between time t0 and time t16 for the individual memory module of the plurality of memory modules. The minimum total time 490 is from (i) at time t0, immediately prior to initiating the first read operation R1 on the first memory module of the plurality of memory modules, to (ii) at time t12, immediately prior to initiating the second read operation R2 on the second memory module of the plurality of memory modules.

The minimum total time 490 is equal to (the row cycle time for the individual memory module of the plurality of memory modules) times (1+1/(a total number of memory modules in the plurality of memory modules)), between immediately prior to initiating the first read operation R1 and immediately prior to initiating the second read operation R2. For instance, as illustrated in FIG. 4, for a total number 2 of memory modules, the minimum total time 490 is equal to the row cycle time 280 times (1+½), between time t0 and time t12. Thus, with two memory modules, the minimum total time is reduced from twice the row cycle time of an individual memory module, as described in connection with FIG. 2, to 1.5 times the row cycle time.

Consecutive write operations of the set of write operations are staggered by a duration equal to the row cycle time of the individual memory module divided by a total number of memory modules in the plurality of memory modules. For instance, for a total number 2 of memory modules, the duration is the row cycle time divided by 2 or half the row cycle time. As illustrated in FIG. 4, the duration between consecutive write operations at time t4 on the second memory module and at time t8 on the first memory module is half the row cycle time 280.

Figure 5:
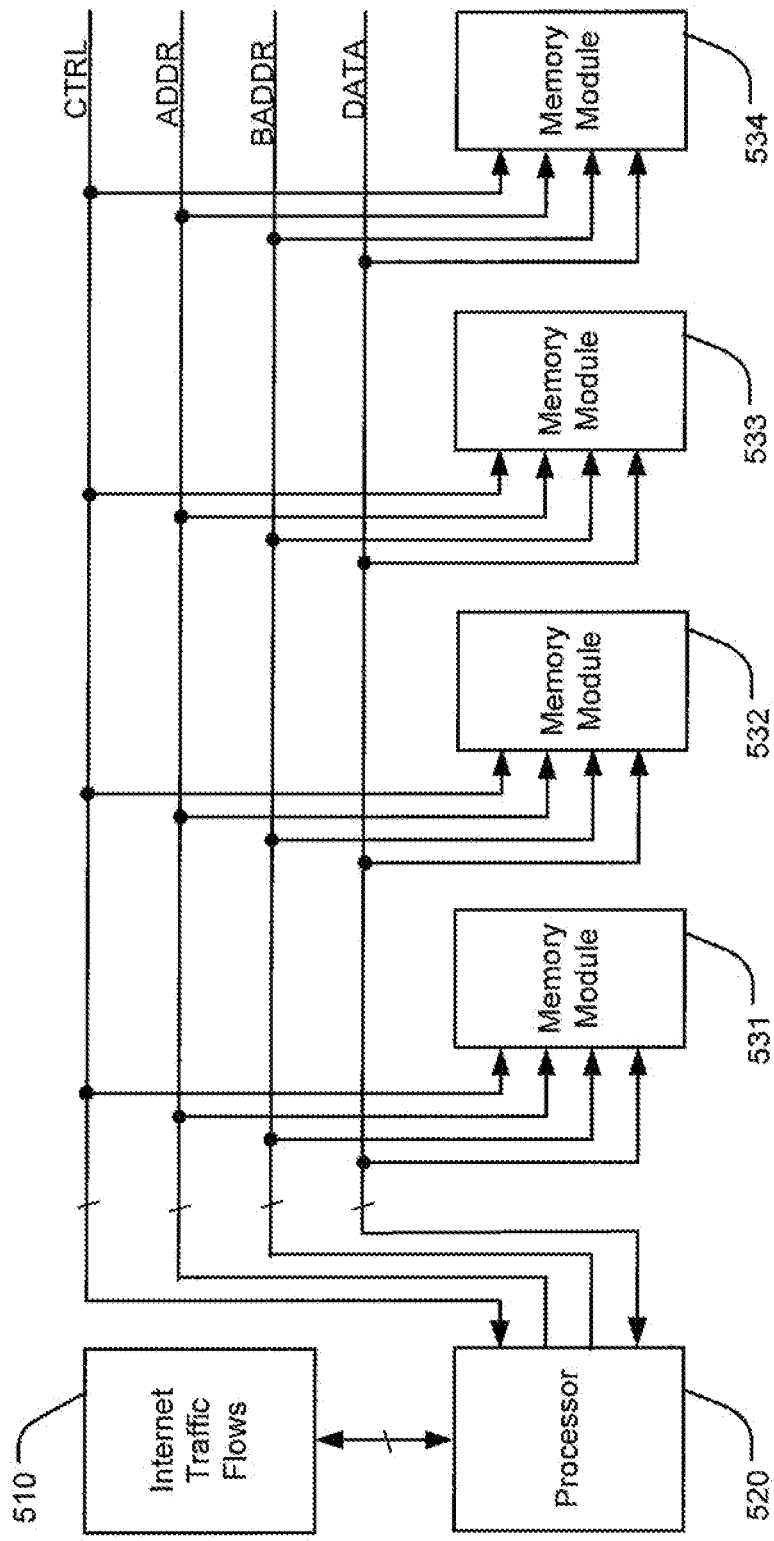
FIG. 5 is a block diagram of an example computer system including four memory modules as illustrated in FIG. 1.

FIG. 5 is a block diagram of an example computer system including a plurality of memory modules. The example computer system can be used for tracking and analyzing internet traffic flows in accordance with the present technology. In reference to FIG. 5, the example computer system includes a processor 520 that communicates with a multiplicity of internet traffic flows 510, and the plurality of memory modules including at least a first memory module 531, a second memory module 532, a third memory module 533, a fourth memory module 534. Although only one processor and only four memory modules are illustrated, one or more processors, and/or more than four memory modules may be configured to perform operations in accordance with the present technology.

In one implementation, memory modules 531, 532, 533, and 534 are instances of the memory module 100 as illustrated in FIG. 1. The example computer system may have physically the same memory location across each memory module. The memory location is determined by the bank address BADDR and the row and column addresses ADDR. Description about the example computer system illustrated in FIG. 3 is generally applicable to the example computer system illustrated in FIG. 5.

Figure 6:
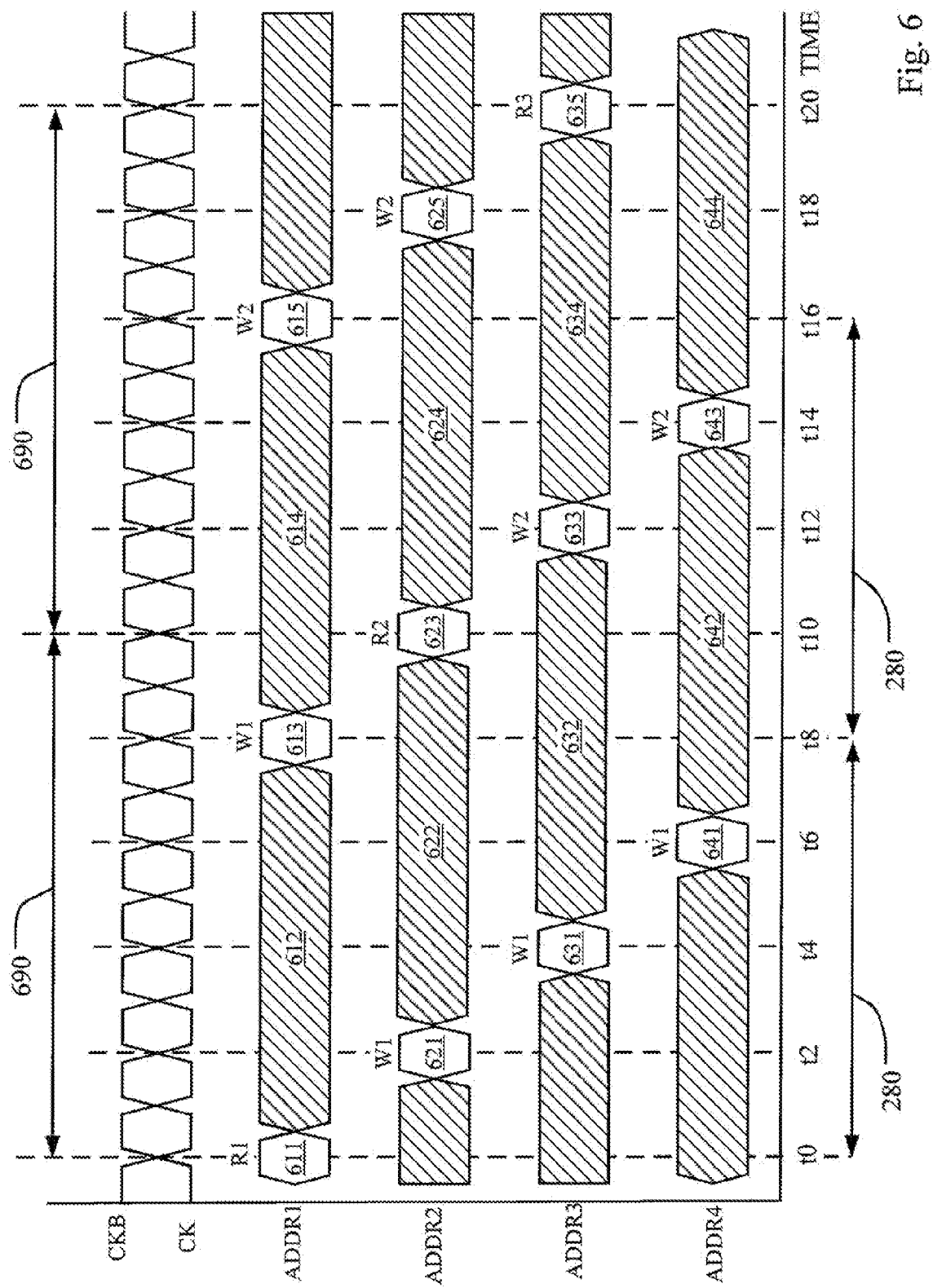
FIG. 6 is a simplified timing diagram illustrating a shortened effective row cycle time with four memory modules.

FIG. 6 is a simplified timing diagram illustrating a shortened effective row cycle time with four memory modules, in accordance with the present technology. The timing diagram includes a pair of differential input signals CK and CKB that coordinates read and write operations of the plurality of memory modules. The timing diagram includes the row and column addresses ADDR1, ADDR2, ADDR3, and ADDR4 corresponding to memory modules 531, 532, 533, and 534 illustrated in FIG. 5, respectively. For brevity, control signals are omitted in FIG. 6. The row and column addresses for a particular bank in one of the four memory modules correspond to the row and column addresses for the same particular bank in other of the four memory modules. Connections of signals between the processor(s) and the memory modules are described in connection with FIG. 5.

The method reduces a row cycle time of an individual memory module to an effective row cycle time shorter than the row cycle time using a plurality of memory modules. The plurality of memory modules may include four memory modules, such as the memory module 531, 532, 533, and 534 as illustrated in FIG. 5. The method has a circular sequence for read and write operations.

The method includes initiating a set of read operations on different memory modules of the plurality of memory modules in the circular sequence from a first read operation initiated on the first module of the plurality of memory modules to a last read operation on a second module. The set of read operations includes at least a first read operation and a second read operation.

After initiating each read operation of the set of read operations on a particular memory module of the plurality of memory modules and prior to initiating a next read operation in the set of read operations, the method includes initiating a set of write operations to write a same value to all of the plurality of memory modules. The set of write operations are in the circular sequence beginning one memory module after the particular memory module. The set of write operations includes at least a first write operation and a last write operation.

In reference to FIG. 6, at time t0, the method initiates a first read operation R1 on the first memory module of the plurality of memory modules, including registering row and column addresses ADDR1 611 for a particular bank, such as Bank 0, of the first memory module.

After initiating the first read operation R1, the method initiates a set of write operations W1 to write a same value to all of the plurality of memory modules. The set of write operations are in a circular sequence from a first write operation, at time t2, initiated on the second memory module of the plurality of memory modules to a last write operation, at time t8, initiated on the first module. The first write operation at time t2 includes registering row and column addresses ADDR2 621 for the same particular bank of the second memory module as for the read operation on the first memory module at time t0. The last write operation at time t8 includes registering row and column addresses ADDR1 613 for the same particular bank of the first memory module as for the read operation on the first memory module at time t0. In-between the first write operation of the set of write operations W1 initiated at time t2 and the last write operation of the set of write operations W1 initiated at time t8, the set of write operations W1 also includes registering row and column addresses ADDR3 631, and row and column addresses ADDR4 641 for the same particular bank of the third and the fourth memory modules as for the read operation on the first memory module at time t0.

After initiating the set of write operations, the method initiates a second read operation R2, at time t10, on the second module of the plurality memory modules. The second read operation R2 includes registering row and column addresses ADDR2 623 for the particular bank of the second memory module.

After initiating the second read operation R2, the method initiates a second set of write operations W2 to write a same value to all of the plurality of memory modules. The second set of write operations W2 are in a circular sequence from a first write operation, at time t12, initiated on the third memory module of the plurality of memory modules to a last write operation, at time t18, initiated on the second module. The first write operation of the second set of write operations W2 at time t12 includes registering row and column addresses ADDR3 633 for the same particular bank of the first memory module as for the second read operation R2 on the second memory module at time t10. The last write operation at time t18 includes registering row and column addresses ADDR2 625 for the same particular bank of the second memory module as for the second read operation R2 on the second memory module at time t10. In-between the first write operation of the second set of write operations W2 initiated at time t12 and the last write operation of the second set of write operations initiated at time t18, the second set of write operations W2 also includes registering row and column addresses ADDR4 643, and row and column addresses ADDR1 615 for the same particular bank of the fourth and the first memory modules as for the read operation on the second memory module at time t10.

After initiating the second set of write operations W2, the method repeats the circular sequence for read and write operations, initiating a third read operation R3, at time t20, on the third module of the plurality memory modules.

For the first memory module, during the time period 612 between time t0 and t8, and the time period 614 between time t8 and t16, the row and column addresses ADDR1 are at "don't care" states, not affecting read or write operations of the memory module. Similarly, during time periods 622 and 624 for the second memory module, during time periods 632 and 634 for the third memory module, and during time periods 642 and 644 for the fourth memory module, the row and column addresses ADDR2, ADDR3, and ADDR4 are at "don't care" states, not affecting read or write operations of the memory modules.

As illustrated in FIG. 6, a minimum total time 690 for read and write operations is less than twice the row cycle time 280 between time t0 and time t16 for the individual memory module of the plurality of memory modules. The minimum total time 690 is from (i) at time t0, immediately prior to initiating the first read operation R1 on the first memory module of the plurality of memory modules, to (ii) at time t10, immediately prior to initiating the second read operation R2 on the second memory module of the plurality of memory modules.

The minimum total time 690 is equal to (the row cycle time for the individual memory module of the plurality of memory modules) times (1+1/(a total number of memory modules in the plurality of memory modules)), between immediately prior to initiating the first read operation R1 and immediately prior to initiating the second read operation R2. For instance, as illustrated in FIG. 6, for a total number 4 of memory modules, the minimum total time 690 is equal to the row cycle time 280 times (1+¼), between time t0 and time t10. Thus, with four memory modules, the minimum total time is reduced from twice the row cycle time of an individual memory module, as described in connection with FIG. 2, to 1.25 times the row cycle time.

Consecutive write operations of the set of write operations are staggered by a duration equal to the row cycle time of the individual memory module divided by a total number of memory modules in the plurality of memory modules. For instance, for a total number 4 of memory modules, the duration is the row cycle time divided by 4 or a quarter of the row cycle time. As illustrated in FIG. 6, the duration between consecutive write operations at time t2 on the second memory module and at time t4 on the third memory module is a quarter of the row cycle time 280.

Figure 7:
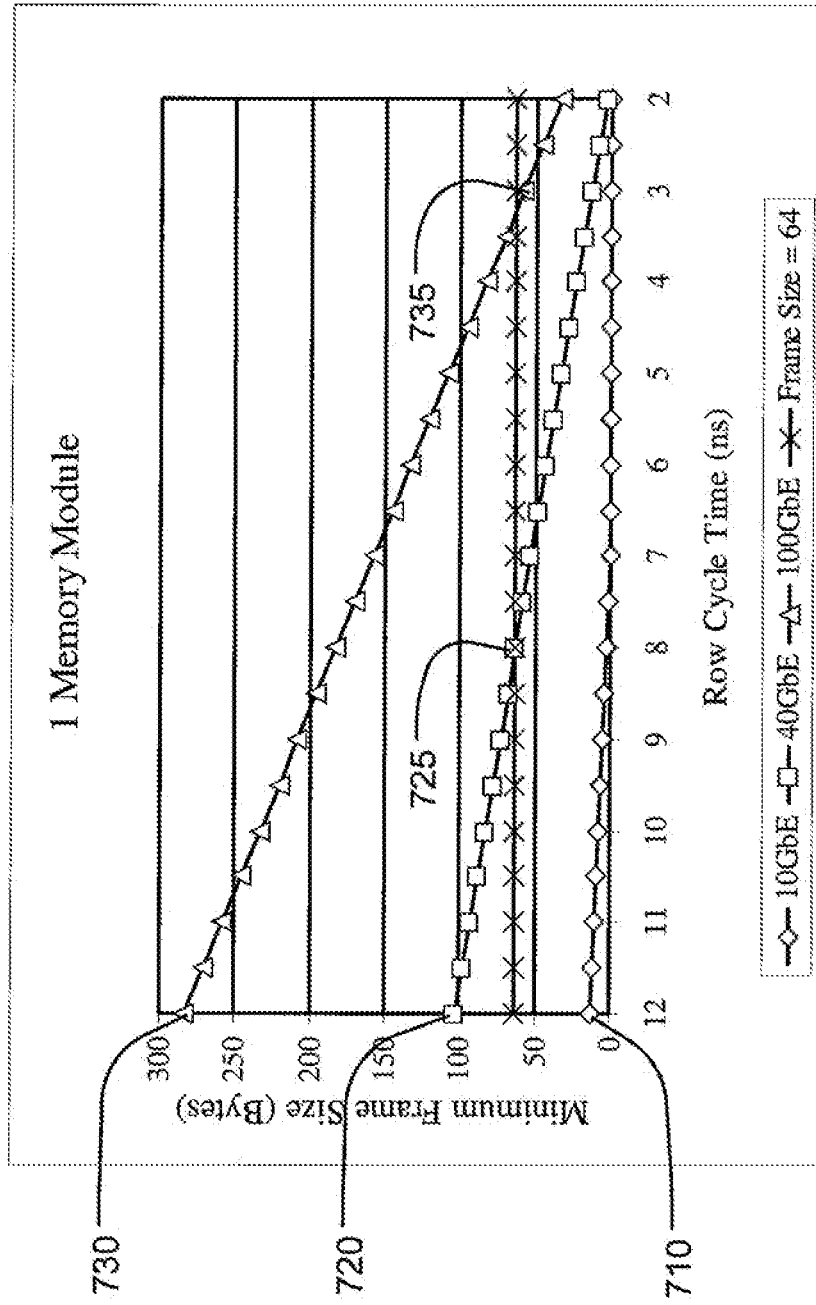
FIG. 7 is a chart illustrating the minimum frame size as a function of the row cycle time using a single memory module.

FIG. 7 is a chart illustrating the minimum frame size as a function of the row cycle time using a single memory module. The chart corresponds to the simplified timing diagram in FIG. 2 illustrating the row cycle time using a single memory module. The chart includes three curves for the function at communication line rates of 10 GbE, 40 GbE, and 100 GbE. The chart also includes a reference line for a minimum frame size at 64 bytes. The minimum frame sizes shown in the chart do not include an 8 byte preamble or a 12 byte gap included with each frame.

The minimum frame size in bytes may be calculated as:

$$\text{minimum frame size} = (1+1/N) \times (\text{row cycle time}) \times R\text{line}/8 - 20$$

where
the minimum frame size is in bytes;
N is the number of memory modules connected in parallel;
Rline is a communication line rate in bits per second;
division by 8 is to convert bits to bytes; and
minus 20 is for the 8 bytes in preamble and 12 bytes in gap included in each frame.

The chart in FIG. 7 illustrates that for slower communication line rates, the row cycle time may not limit the read and write operations within the same bank of memory arrays. For instance, at a communication line rate of 10 GbE, when the row cycle time is as high as 12 ns, the corresponding minimum frame size is about 13 bytes (710), below the minimum frame size of 64 bytes.

At a higher communication line rate of 40 GbE, when the row cycle time is 12 ns, the corresponding minimum frame size is about 100 bytes (720), which is above the minimum frame size of 64 bytes. To lower the minimum frame size to the minimum frame size of 64 bytes, the row cycle time is required to be as low as about 8 ns (725).

At an even higher communication line rate of 100 GbE, when the row cycle time is 12 ns, the corresponding minimum frame size is over 275 bytes (730), which is above the minimum frame size of 64 bytes. To lower the minimum frame size to the minimum frame size of 64 bytes, the row cycle time is required to be as low as about 3 ns (735).

Figure 8:
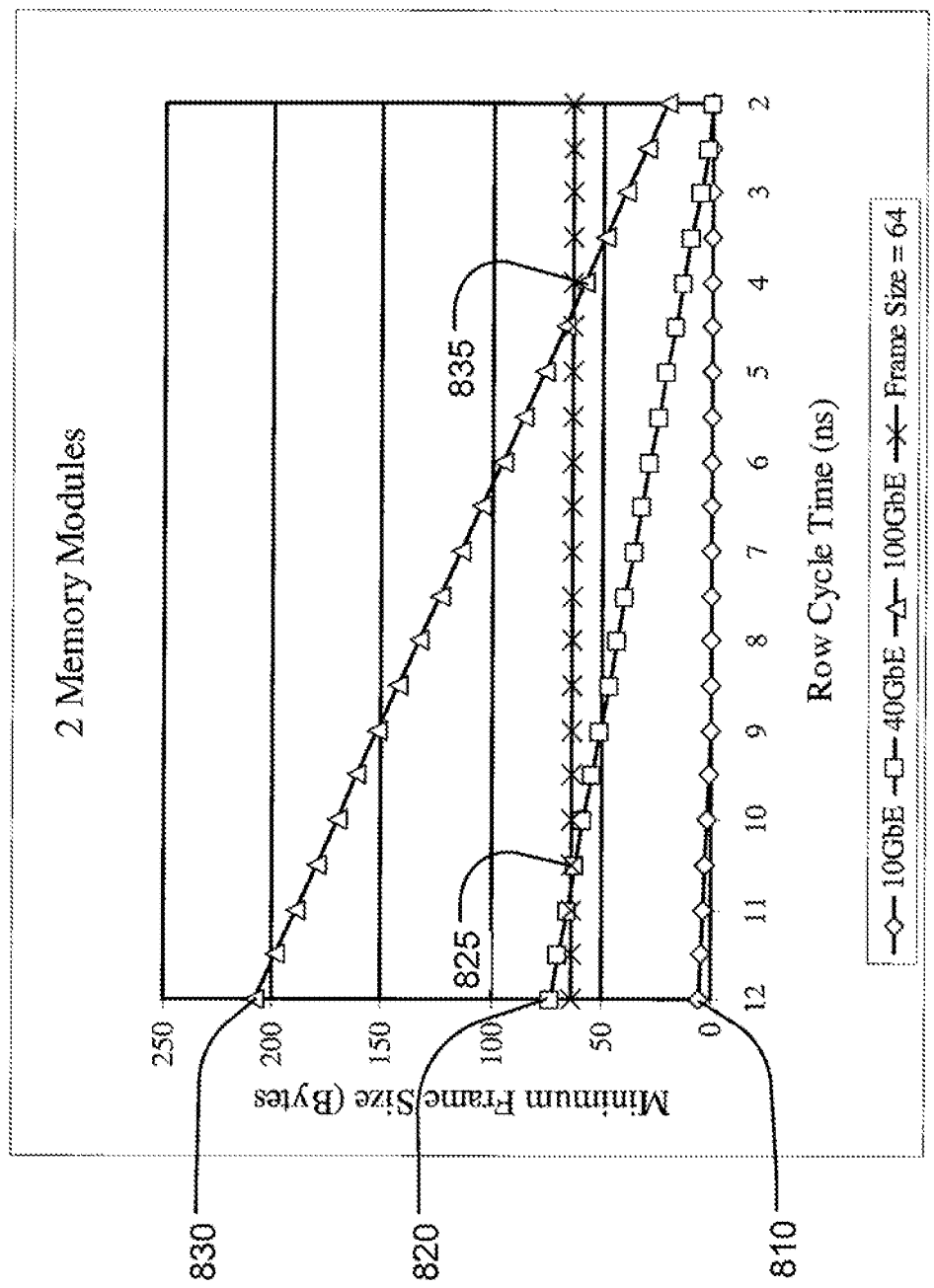
FIG. 8 is a chart illustrating the minimum frame size as a function of the minimum row cycle time using two memory modules.

FIG. 8 is a chart illustrating the minimum frame size as a function of the minimum row cycle time using two memory modules. The chart corresponds to the simplified timing diagram in FIG. 4 illustrating the row cycle time using two memory modules. The chart includes three curves for the function at communication line rates of 10 GbE, 40 GbE, and 100 GbE. The chart also includes a reference line for a minimum frame size at 64 bytes. The minimum frame sizes shown in the chart do not include an 8 byte preamble or a 12 byte gap included with each frame.

The chart in FIG. 8 illustrates that for slower communication line rates, the row cycle time may not limit the read and write operations within the same bank of memory arrays. For instance, at a communication line rate of 10 GbE, when the row cycle time is as high as 12 ns, the corresponding minimum frame size is about 6 bytes (810), below the minimum frame size of 64 bytes.

At a higher communication line rate of 40 GbE, when the row cycle time is 12 ns, the corresponding minimum frame size is about 75 bytes (820), which is above the minimum frame size of 64 bytes. To lower the minimum frame size to the minimum frame size of 64 bytes, the row cycle time is required to be as low as about 10.5 ns (825). In comparison, the row cycle time is required to be as low as about 8 ns at the communication line rate of 40 GbE (725) to lower the minimum frame size to 64 bytes when only one memory module is used, as described with FIG. 7.

At an even higher communication line rate of 100 GbE, when the row cycle time is 12 ns, the corresponding minimum frame size is over 200 bytes (830), which is above the minimum frame size of 64 bytes. To lower the minimum frame size to 64 bytes, the row cycle time is required to be as low as about 4 ns (835). In comparison, the row cycle time is required to be as low as about 3 ns at the communication line rate of 100 GbE (735) to lower the minimum frame size to 64 bytes when only one memory module is used, as described with FIG. 7.

Figure 9:
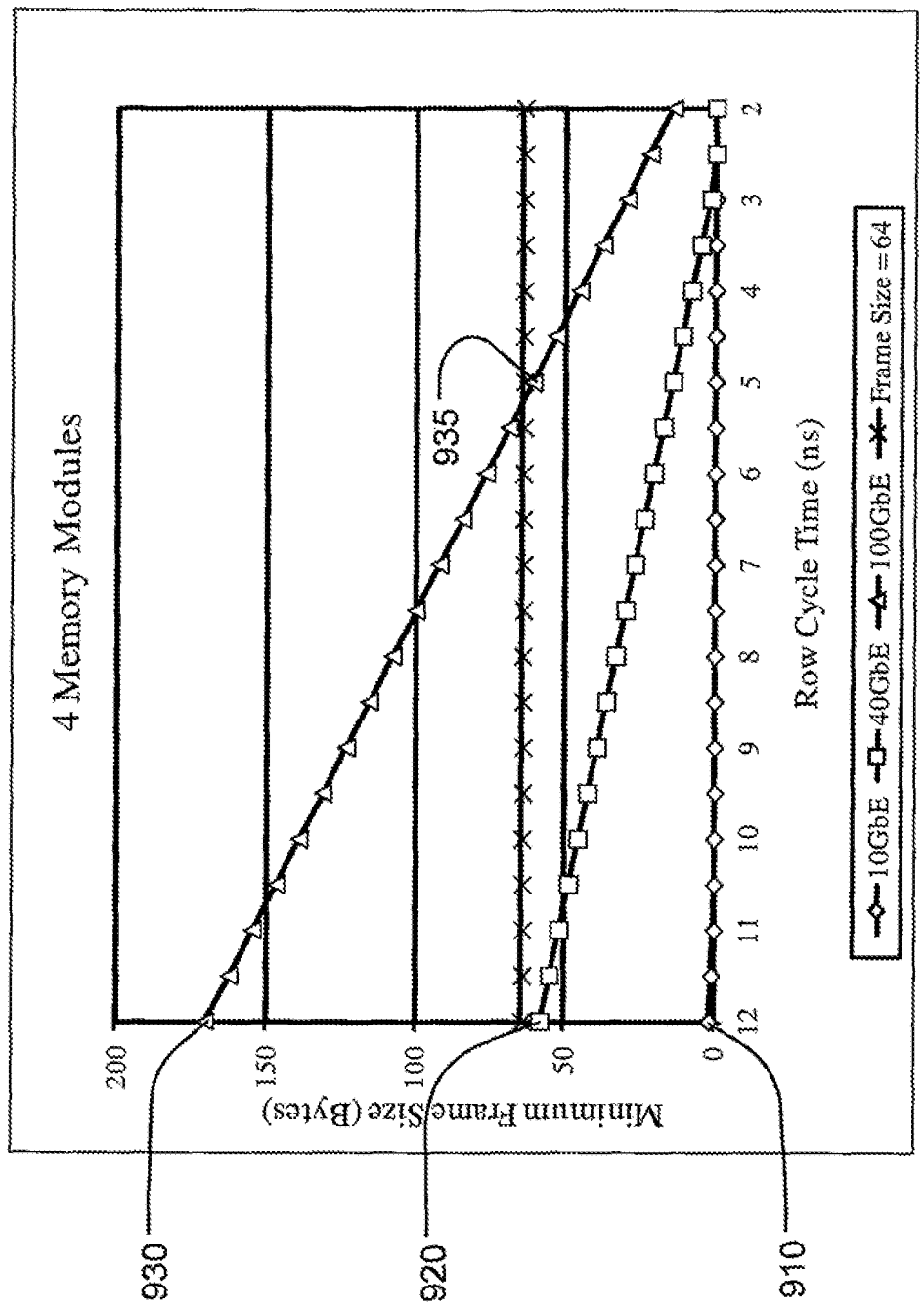
FIG. 9 is a chart illustrating the minimum frame size as a function of the minimum row cycle time using four memory modules.

FIG. 9 is a chart illustrating the minimum frame size as a function of the minimum row cycle time using four memory modules. The chart corresponds to the simplified timing diagram in FIG. 6 illustrating the row cycle time using four memory modules. The chart includes three curves for the function at communication line rates of 10 GbE, 40 GbE, and 100 GbE. The chart also includes a reference line for a minimum frame size at 64 bytes. The minimum frame sizes shown in the chart do not include an 8 byte preamble or a 12 byte gap included with each frame.

The chart in FIG. 9 illustrates that for slower communication line rates, the row cycle time may not limit the read and write operations within the same bank of memory arrays. For instance, at a communication line rate of 10 GbE, when the row cycle time is as high as 12 ns, the corresponding minimum frame size is about 2 bytes (910), below the minimum frame size of 64 bytes.

At a higher communication line rate of 40 GbE, when the row cycle time is 12 ns, the corresponding minimum frame size is about 58 bytes (920), which is also below the minimum frame size of 64 bytes. In comparison, the row cycle time is required to be as low as about 8 ns at the communication line rate of 40 GbE (725) to lower the minimum frame size to 64 bytes when only one memory module is used, as described with FIG. 7.

At an even higher communication line rate of 100 GbE, when the row cycle time is 12 ns, the corresponding minimum frame size is about 170 bytes (930), which is above the minimum frame size of 64 bytes. To lower the minimum frame size to 64 bytes, the row cycle time is required to be as low as about 5 ns (935). In comparison, the row cycle time is required to be as low as about 3 ns at the communication line rate of 100 GbE (735) to lower the minimum frame size to 64 bytes when only one memory module is used, as described with FIG. 7.

The memory module described herein may be an integrated circuit memory device in a single-module chip. The memory module may be one of a number of integrated circuit devices in a multi-module chip, where the number of integrated circuit devices may include other components such as memory modules like the memory module described herein, cache memories, processors, co-processors, etc.

Figures 10A, 10B:
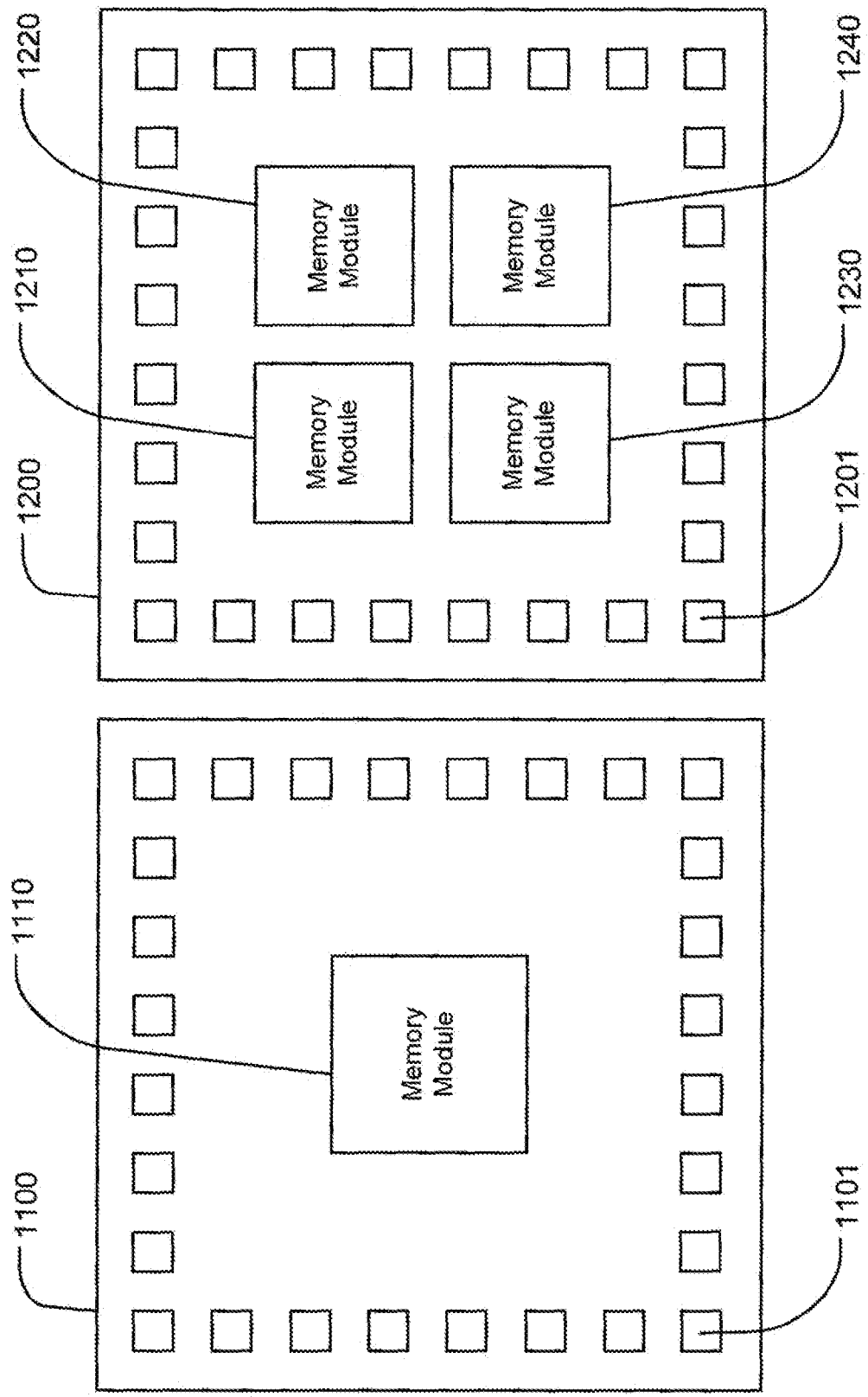
FIG. 10A illustrates a chip diagram of an example single-module chip.
FIG. 10B illustrates a chip diagram of an example multiple-module chip.

FIG. 10A illustrates a chip diagram of an example single-module chip 1100. The single-module chip 1100 includes an integrated circuit memory device 1110 that can be a memory module such as the memory module 100 described in connection with FIG. 1. The single-module chip 1100 includes a plurality of pads such as pad 1101 coupled to the integrated circuit memory device 1110 for wire bonding to an IC package.

FIG. 10B illustrates a chip diagram of an example multiple-module chip 1200. The multiple-module chip 1200 includes integrated circuit memory devices 1210, 1220, 1230 and 1240 that can be memory modules such as the memory module 100 described in connection with FIG. 1. The multiple-module chip 1200 includes a plurality of pads such as pad 1201 coupled to the integrated circuit memory devices 1210, 1220, 1230 and 1240 for wire bonding to an IC package.

The present technology reduces a row cycle time of an individual memory module to an effective row cycle time shorter than the row cycle time using a plurality of memory modules. The present technology can be applicable to read and write operations within a same bank of memory arrays whether there is a modify operation between the read and write operations. The present technology can be applicable to read and write operations within a same bank of memory arrays whether the read and write operations are at a same memory location within the same bank.

The present technology can be applicable to applications that require a shorter effective row cycle time in read and write operations of memory modules. For example, the present technology can be applicable to types of memory that don't use banks or row cycle times, such as SRAMs (static random-access memory). Access times of SRAMs may be limited by clock frequencies. By using staggered clock phases to multiple SRAM modules, the present technology can effectively increase the access times of SRAMs.

For example, a clock cycle for SRAM read and write operations may be divided into a number of phases. At phase 0, a first read operation may be initiated on a first SRAM module of a plurality of SRAM modules connected in parallel. After the first read operation, a set of write operations may be initiated to write a same value to the plurality of SRAM modules at subsequent phases. After the set of write operations corresponding to the first read operations, a second read operations on a second SRAM module of the plurality of SRAM modules may be initiated.

Any of the methods described above or aspects of the methods may be embodied in a device adapted to reduce a row cycle time of an individual memory module to an effective row cycle time shorter than the row cycle time using a plurality of memory modules. The device may include a processor, memory coupled to the processor, one or more ports coupled to the processor (or the memory).

The methods described immediately above and aspects or embodiments of the methods may be embodied in a controller adapted to reduce a row cycle time of an individual memory module to an effective row cycle time shorter than the row cycle time using a plurality of memory modules.

Some Particular Implementations

The technology disclosed may be practiced as a method or device. One implementation of the technology disclosed is a method that reduces a row cycle time of an individual memory module to an effective row cycle time shorter than the row cycle time using a plurality of memory modules having a circular sequence. The method includes initiating a set of read operations on different memory modules of the plurality of memory modules in the circular sequence from a first read operation initiated on a first module of the plurality of memory modules to a last read operation initiated on a second module. The method includes, after initiating each read operation of the set of read operations on a particular memory module of the plurality of memory modules and prior to initiating a next read operation in the set of read operations, initiating a set of write operations to write a same value to all of the plurality of memory modules in the circular sequence beginning one memory module after the particular memory module.

These and additional implementations can include one or more of the following features. In some implementations, a minimum total time for read and write operations is less than twice the row cycle time for the individual memory module of the plurality of memory modules, from (i) immediately prior to initiating a first of two consecutive read operations in the set of read operations, to (ii) immediately prior to initiating a second of the two consecutive read operations in the set of read operations. Further, consecutive write operations of the set of write operations are staggered by a duration equal to the row cycle time of the individual memory module divided by a total number of memory modules in the plurality of memory modules. A minimum total time for read and write operations is equal to:

((the row cycle time for the individual memory module of the plurality of memory modules)*(1+1/(a total number of memory modules in the plurality of memory modules))), between immediately prior to initiating a first of two consecutive read operations in the set of read operations and immediately prior to initiating a second of the two consecutive read operations in the set of read operations.

Another implementation of the technology disclosed is a method that reduces a row cycle time of an individual memory module to an effective row cycle time shorter than the row cycle time using a plurality of memory modules including at least a first module and a second module. The method includes initiating a first read operation on the first module of the plurality of memory modules. The method includes, after initiating the first read operation, initiating a set of write operations to write a same value to all of the plurality of memory modules, the set of write operations in a circular sequence from a first write operation initiated on the second module of the plurality of memory modules to a last write operation initiated on the first module. The method further includes, after initiating the set of write operations, initiating a second read operation on the second module of the plurality of memory modules.

These and additional implementations can include one or more of the following features. In some implementations, a minimum total time for read and write operations is less than twice the row cycle time for the individual memory module of the plurality of memory modules, from (i) immediately prior to initiating the first read operation on the first memory module of the plurality of memory modules, to (ii) immediately prior to initiating the second read operation on the second memory module of the plurality of memory modules. Further, consecutive write operations of the set of write operations are staggered by a duration equal to the row cycle time of the individual memory module divided by a total number of memory modules in the plurality of memory modules. A minimum total time for read and write operations is equal to:

((the row cycle time for the individual memory module of the plurality of memory modules)*(1+1/(a total number of memory modules in the plurality of memory modules))), between immediately prior to initiating the first read operation and immediately prior to initiating the second read operation.

Yet another implementation of the technology disclosed is a method that reduces a row cycle time of an individual memory module to an effective row cycle time shorter than the row cycle time using a plurality of memory modules including at least a first module and a second module. The method includes initiating read and write operations on the plurality of memory modules, where a minimum total time for read and write operations is less than twice the row cycle time for the individual memory module of the plurality of memory modules, for performing all of: (i) initiating a first read operation on the first memory module of the plurality of memory modules, (ii) initiating a set of write operations of a same data value on all memory modules, and (iii) initiating a second read operation on the second memory module of the plurality of memory modules.

These and additional implementations can include one or more of the following features. In some implementations, a minimum total time for read and write operations is less than twice the row cycle time for the individual memory module of the plurality of memory modules, from (i) immediately prior to initiating a first of two consecutive read operations in the set of read operations, to (ii) immediately prior to initiating a second of the two consecutive read operations in the set of read operations. Further, consecutive write operations of the set of write operations are staggered by a duration equal to the row cycle time of the individual memory module divided by a total number of memory modules in the plurality of memory modules. A minimum total time for read and write operations is equal to:

((the row cycle time for the individual memory module of the plurality of memory modules)*(1+1/(a total number of memory modules in the plurality of memory modules))), between immediately prior to initiating the first read operation and immediately prior to initiating the second read operation.

As mentioned above, the technology disclosed may be implemented in a computer system that reduces a row cycle time of an individual memory module to an effective row cycle time shorter than the row cycle time using a plurality of memory modules having a circular sequence. The computer system includes one or more processors configured to perform operations implementing methods described herein and any of the features and optional implementations of the methods described.

While examples and implementations of the technology disclosed are detailed above, it is understood that these examples are intended in an illustrative rather than in a limiting sense. Computer-assisted processing is implicated in the described embodiments. Accordingly, the technology disclosed may be embodied in methods for reducing a row cycle time of an individual memory module to an effective row cycle time shorter than the row cycle time using a plurality of memory modules, systems including logic and resources to reduce a row cycle time of an individual memory module to an effective row cycle time shorter than the row cycle time using a plurality of memory modules, systems that take advantage of computer-assisted reducing a row cycle time of an individual memory module to an effective row cycle time shorter than the row cycle time using a plurality of memory modules, media impressed with logic to reduce a row cycle time of an individual memory module to an effective row cycle time shorter than the row cycle time using a plurality of memory modules, data streams impressed with logic to reduce a row cycle time of an individual memory module to an effective row cycle time shorter than the row cycle time using a plurality of memory modules, or computer-accessible services that carry out computer-assisted reducing a row cycle time of an individual memory module to an effective row cycle time shorter than the row cycle time using a plurality of memory modules. It is contemplated that modifications and combinations will readily occur to those skilled in the art, which modifications and combinations will be within the spirit of the invention and the scope of the following claims.

The invention claimed is:

1. A method that reduces a row cycle time of an individual memory module to an effective row cycle time shorter than the row cycle time using a plurality of memory modules having a circular sequence, including:
   initiating a set of read operations on different memory modules of the plurality of memory modules in the circular sequence from a first read operation initiated on a first module of the plurality of memory modules to a last read operation initiated on a second module; and
   after initiating each read operation of the set of read operations on a particular memory module of the plurality of memory modules and prior to initiating a next read operation in the set of read operations, initiating a set of write operations to write a same value to all of the plurality of memory modules in the circular sequence beginning one memory module after the particular memory module, wherein the set of write operations completes prior to the next read operation.

2. The method of claim 1, wherein a minimum total time for read and write operations is less than twice the row cycle time for the individual memory module of the plurality of memory modules, measured from (i) immediately prior to initiating a first of two consecutive read operations in the set of read operations, to (ii) immediately prior to initiating a second of the two consecutive read operations in the set of read operations.

3. The method of claim 1, wherein consecutive write operations of the set of write operations are staggered by a duration equal to the row cycle time of the individual memory module divided by a total number of memory modules in the plurality of memory modules.

4. The method of claim 1, wherein a minimum total time for read and write operations is equal to:

((the row cycle time for the individual memory module of the plurality of memory modules)*(1+1/(a total number of memory modules in the plurality of memory modules))), between immediately prior to initiating a first of two consecutive read operations in the set of read operations and immediately prior to initiating a second of the two consecutive read operations in the set of read operations.

5. A method that reduces a row cycle time of an individual memory module to an effective row cycle time shorter than the row cycle time using a plurality of memory modules including at least a first module and a second module, including:
   initiating a first read operation on the first module of the plurality of memory modules;
   after initiating the first read operation, initiating a set of write operations to write a same value to all of the plurality of memory modules, the set of write operations in a circular sequence from a first write operation initiated on the second module of the plurality of memory modules to a last write operation initiated on the first module; and
   after initiating the set of write operations, initiating a second read operation on the second module of the plurality of memory modules.
   wherein the set of write operations completes prior to the second read operation.

6. The method of claim 5, wherein a minimum total time for read and write operations is less than twice the row cycle time for the individual memory module of the plurality of memory modules, measured from (i) immediately prior to initiating the first read operation on the first memory module of the plurality of memory modules, to (ii) immediately prior to initiating the second read operation on the second memory module of the plurality of memory modules.

7. The method of claim 5, wherein consecutive write operations of the set of write operations are staggered by a duration equal to the row cycle time of the individual memory module divided by a total number of memory modules in the plurality of memory modules.

8. The method of claim 5, wherein a minimum total time for read and write operations is equal to:

((the row cycle time for the individual memory module of the plurality of memory modules)*(1+1/(a total number of memory modules in the plurality of memory modules))), between immediately prior to initiating the first read operation and immediately prior to initiating the second read operation.

9. A computer system that reduces a row cycle time of an individual memory module to an effective row cycle time shorter than the row cycle time using a plurality of memory modules having a circular sequence, the computer system including one or more processors configured to perform operations including:
   initiating a set of read operations on different memory modules of the plurality of memory modules in the circular sequence from a first read operation initiated on a first module of the plurality of memory modules to a last read operation initiated on a second module; and
   after initiating each read operation of the set of read operations on a particular memory module of the plurality of memory modules and prior to initiating a next read operation in the set of read operations, initiating a set of write operations to write a same value to all of the plurality of memory modules in the circular sequence beginning one memory module after the particular memory module, wherein the set of write operations completes prior to the next read operation.

10. The computer system of claim 9, wherein a minimum total time for read and write operations is less than twice the row cycle time for the individual memory module of the plurality of memory modules, measured from (i) immediately prior to initiating a first of two consecutive read operations in the set of read operations, to (ii) immediately prior to initiating a second of the two consecutive read operations in the set of read operations.

11. The computer system of claim 9, wherein consecutive write operations of the set of write operations are staggered by a duration equal to the row cycle time of the individual memory module divided by a total number of memory modules in the plurality of memory modules.

12. The computer system of claim 9, wherein a minimum total time for read and write operations is equal to:

((the row cycle time for the individual memory module of the plurality of memory modules)*(1+1/(a total number of memory modules in the plurality of memory modules))), between immediately prior to initiating a first of two consecutive read operations in the set of operations and immediately prior to initiating a second of the two consecutive read operations in the set of operations.

13. A computer system that reduces a row cycle time of an individual memory module to an effective row cycle time shorter than the row cycle time using a plurality of memory modules including at least a first module and a second module, the computer system including one or more processors configured to perform operations including:
   initiating a first read operation on the first module of the plurality of memory modules;
   after initiating the first read operation, initiating a set of write operations to write a same value to all of the plurality of memory modules, the set of write operations in a circular sequence from a first write operation initiated on the second module of the plurality of memory modules to a last write operation initiated on the first module; and
   after initiating the set of write operations, initiating a second read operation on the second module of the plurality of memory modules,.
   wherein the set of write operations completes prior to the second read operation.

14. The computer system of claim 13, wherein a minimum total time for read and write operations is less than twice the row cycle time for the individual memory module of the plurality of memory modules, measured from (i) immediately prior to initiating the first read operation on the first memory module of the plurality of memory modules, to (ii) immediately prior to initiating the second read operation on the second memory module of the plurality of memory modules.

15. The computer system of claim 13, wherein consecutive write operations of the set of write operations are staggered by a duration equal to the row cycle time of the individual memory module divided by a total number of memory modules in the plurality of memory modules.

16. The computer system of claim 13, wherein a minimum total time for read and write operations is equal to:

((the row cycle time for the individual memory module of the plurality of memory modules)*(1+1/(a total number of memory modules in the plurality of memory modules))), between immediately prior to initiating the first read operation and immediately prior to initiating the second read operation.

* * * * *